United States Patent

Tseng

[11] Patent Number: 5,814,526
[45] Date of Patent: Sep. 29, 1998

[54] METHOD OF FORMING A DRAM STACKED CAPACITOR WITH A TWO STEP LADDER STORAGE NODE

[75] Inventor: Horng-Huei Tseng, Hsinchu, Taiwan

[73] Assignee: Vanguard International Semiconductor Corporation, Hsin-Chu, Taiwan

[21] Appl. No.: 665,118

[22] Filed: Jun. 14, 1996

[51] Int. Cl.[6] ................................................ H01L 21/8242
[52] U.S. Cl. .............................. 437/60; 437/919; 437/977
[58] Field of Search ............................. 437/60, 193, 919, 437/977; 148/DIG. 138

[56] References Cited

U.S. PATENT DOCUMENTS

| | | | |
|---|---|---|---|
| 5,405,799 | 4/1995 | Woo et al. | 437/977 |
| 5,451,537 | 9/1995 | Tseng et al. | 437/52 |
| 5,468,670 | 11/1995 | Ryou | 437/60 |
| 5,492,849 | 2/1996 | Pork | 437/60 |

Primary Examiner—Chandra Chaudhari
Attorney, Agent, or Firm—George O. Saile; Stephen B. Ackerman; William J. Stoffel

[57] ABSTRACT

The present invention provides a method of manufacturing a capacitor having a two step ladder cross sectional shape. The method begins by forming a first conformal layer and a first insulation layer over a substrate. A contact hole is opened through the first conformal layer and the first insulation layer. A first conductive layer and a first masking layer are formed over the first insulation layer and in the contact opening. Then, the first masking layer and the first conductive layer are patterned to form a first ridge over at least portions of the source region. A first dielectric layer composed of silicon oxide is then formed over the first conductive layer. The first dielectric layer is anisotropically etched to form spacers on the sidewalls of the ridge. The first conducive layer and the first masking layer are anisotropically etched using the spacers as an etch mask thereby forming the storage electrode having a two step ladder cross sectional shape from the remaining first polysilicon layer. The first masking layer, the spacers, and the first insulation layer are removed. A capacitor dielectric layer and a top plate electrode are formed over the storage electrode to form the capacitor. The storage electrode with the two step ladder cross sectional shape reduces the surface topology without reducing capacitance.

16 Claims, 5 Drawing Sheets

METHOD OF FORMING A DRAM STACKED CAPACITOR WITH A TWO STEP LADDER STORAGE NODE

BACKGROUND OF INVENTION

1) Field of the Invention

This invention relates generally to the fabrication of capacitors and more particularly to the fabrication of stacked capacitor arrays for a memory device.

2) Description of the Prior Art

A typical DRAM cell consists of a single transistor and a storage capacitor. Digital information is stored in the capacitor and accessed through the transistor, by the way of addressing the desired memory cell, which is connected with other such cells through an array of bit lines and word lines. In order to construct high density DRAMs in a reasonably sized chip area, both the transistor and capacitor element must occupy less lateral space in each memory cell.

As DRAMs are scaled down in dimensions, there is a continuous challenge to maintain a sufficiently high stored charge per capacitor unit area. In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM cells continues to increase for future generations of memory devices. The ability to densely pack storage cells while maintaining required storage capability is a crucial requirement of semiconductor manufacturing technologies if future generations of expanded memory array devices are to be successfully manufactured.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors. In order to increase the surface area of the capacitor, there have also been proposed methods of forming a capacitor with a pin structure extending throughout a multi-layer structure of the capacitor to connect the layers with one another, and methods of forming a capacitor using a hemispherical grain polysilicon (HSG) process using polysilicon grains.

A problem with current methods of fabricating stacked capacitors is that in order to maintain sufficient capacitance, the capacitor must be formed significantly above the surface of the substrate in which the DRAM cells are formed, thus leading to topological problems in the formation of subsequent layers. The problem decreases chip yields and forces manufactures to modify the processes for subsequent overlying layers.

Workers in the art are aware of the density and topological limitation of present capacitors and have attempted to resolve them. U.S. Pat. No. 5,451,537 (Tseng) teaches a method of forming a storage node using a process of removing a portion of the vertical walls of a photoresist mask and removing a portion of the top surface of a polysilicon storage node. However, this method involves repeated photo etch back and polysilicon etching steps which increase process complexity. Moreover, many of the other prior art methods require substantially more processing steps or/and planar structures which make the manufacturing process more complex and costly. Therefore, it is very desirable to develop processes that are as simple as possible and maximize the capacitance per unit area. There is a challenge to develop methods of manufacturing these capacitors that minimize the manufacturing costs and maximize the device yields. In particular, there is a challenge to develop a method which reduces the topography changes, without decreasing capacitance and packing density.

SUMMARY OF THE INVENTION

It is an object of the present invention to provide a method for fabricating a capacitor which can produce a smooth topology and increase yields.

It is an object of the present invention to provide a method for fabricating a stacked capacitor with a two step ladder cross sectional shape which produces a smooth topology.

To accomplish the above objectives, the present invention provides a method of manufacturing a capacitor for a DRAM having a two step ladder cross sectional shape. The method begins by providing a MOS (metal oxide semiconductor) device having source and drain regions, adjacent to a field oxide region on which there is a conductive word line 27, in a silicon substrate. A first conformal layer 28 composed of silicon nitride and a first insulation layer 30 composed of silicon oxide are formed over the MOS device, the conductive word line and the field oxide region. The first conformal layer 28 and the first insulation layer 30 are patterned to form a contact opening to the source region. A first conductive layer 32 composed of polysilicon and a first masking layer 34 composed of silicon oxide are formed over the first insulation layer 28 30 and in the contact opening. Then, the first masking layer 34 and the first conductive layer 32 are etched to form a first ridge 38 over at least portions of the source region 26. A first dielectric layer 40 composed of silicon oxide is then formed over the first conductive layer 32. The first dielectric layer 40 is anisotropically etched to form spacers 42 on the sidewalls of the ridge 38. The first conductive layer 32 and the first masking layer 34 are anisotropically etched using the spacers 42 as an etch mask thereby forming the storage electrode having a two step latter cross sectional shape from the remaining first polysilicon layer 32. The first masking layer 34, the spacers 42, and the first insulation layer 30 are removed. A capacitor dielectric layer 46 is formed over the two step latter storage electrode 45. A top plate electrode is formed over the capacitor dielectric layer over the storage electrode 45 to form the capacitor and memory cell.

The process of the invention provides a high capacitance and dense capacitor which produces has a smooth topology. The two steps in the storage electrode produce a smooth surface which will not interfere with the overlying layers and therefore increases yields. The process is simple to manufacture and the spacers and the first insulation layer 30 allow tight dimensional process control of the steps sizes.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

To accomplish the above objectives, the present invention provides a method of manufacturing a capacitor for a DRAM having a two step ladder cross sectional shape. The present invention will be described in detail with reference to the accompanying drawings. The present invention provides a method of forming a DRAM having a stacked capacitor which has small dimension, high capacitance and is simple to manufacture. The process for forming the field oxide (FOX) and the field effect transistor structure as presently practiced in manufacturing DRAM cells are only briefly described in order to better understand the current invention. The term "substrate" is mean to include devices formed within a semiconductor wafer, such as doped regions, and the layers overlying the wafer, such as insulation and conductive layers. The term "substrate surface" is meant to include the upper most exposed layers on a semiconductor wafer, such as a silicon surface, an insulating layer and conductive lines.

Figure 1:
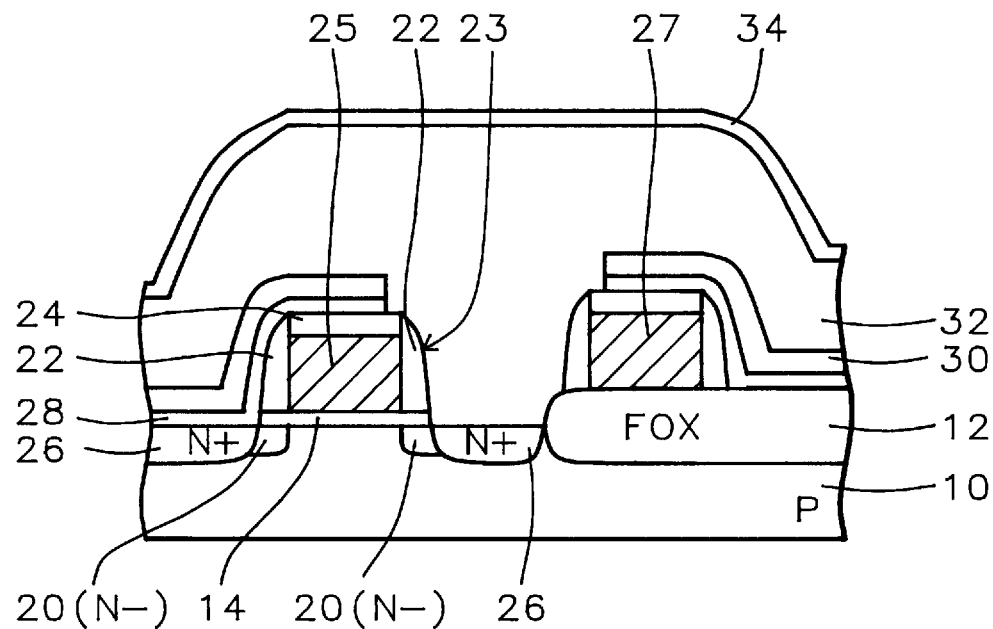
FIGS. 1 through 6 are cross sectional views for illustrating a method for manufacturing the stacked capacitor having a storage electrode with a two step ladder cross sectional shape according to the present invention.

As shown in FIG. 1, the method for fabricating a capacitor begins by providing a substrate having a field oxide layer 12 and MOSFET devices formed thereon. Field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. One method of forming these regions is described by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The preferred thickness of the field oxide is preferably in a range between about 3000 and 6000 Å.

An optional channel stop implant (not shown) can be formed either before or after FOX 12 formation by ion implanting boron at a concentration of between about 2E12 and 5E13 atoms/cm$^2$ and at an energy between about 120 and 180 KeV.

The semiconductor field effect transistor (FET) device is then formed in the active device area. The most commonly used device for dynamic random access memories (DRAM) are metal oxide semiconductor field effect transistors (MOSFET's). The formation of the field effect transistors shown in FIG. 1 will be describe next. A gate oxide layer 14 is formed, typically by thermal oxidation of the silicon substrate, with a thickness between about 100 and 200 Å. An appropriately doped polysilicon layer, and an insulating layer are deposited on substrate 10 and conventional photolithographic techniques are used to pattern these layers to form the gate electrodes 14 25 24. The gates are formed on the substrate disposed between the field oxide regions 12 and on the field oxide regions. The gates on the substrate form the gate electrodes 25 of the MOSFET's in the active device areas. The gates formed over the field oxide 12 form word lines 27 that electrically connect the MOSFET gate electrode to the appropriate peripheral circuits on the DRAM chip.

The lightly doped source/drain 20 of the N-channel MOSFET are formed next, usually by implanting an N-type atomic species such as arsenic or phosphorus through the spaces between the gate electrodes 14 24 25. For example, a typical implant might consist of phosphorus P31 at a dose of between about 1E13 to 1E14 atoms/cm$^2$ and at an energy between about 30 to 80 Kev.

After forming the lightly doped source/drains 20, sidewall spacers 22 are formed on the gate electrode 14 24 25 sidewalls. These sidewall spacers 20 are preferably formed by depositing a low temperature silicon oxide and anisotropically etching back to the silicon surface. For example, the silicon oxide could be formed by a chemical vapor deposition using tetraethoxysilane (TEOS) at a temperature in a range of about 650° to 900° C. and the etch back performed in a low pressure reactive ion etcher with a fluorine gas, such as $C_2F_6$ (carbon hexafluoride) or $CF_4+H_2$ (carbon tetrafluoride and hydrogen).

The source/drain 26 regions of the MOSFET are now implanted between the spacers with a N type atomic species, for example, arsenic (As75), to complete the source/drain (i.e., the source is the node contact) 26. As shown in FIG. 1, the source 26 is typically formed between gate 25 and the word line 27. The implantation is usually done through a thin layer of silicon oxide of about 200 to 300 Å in thickness to minimize implant channeling and to protect against contamination by metals and other impurities. A typical implantation dose is between 2E15 to 1E16 atoms/cm$^2$ and a typical energy is between about 20 to 70 Kev.

As shown in FIG. 1, a first conformal layer 28 is formed over the substrate surface including the MOS device 22 24 25 26, conductive word line 25 and the field oxide region 12. The conformal layer 28 is preferably composed of a silicon nitride. Layer 28 preferably has a thickness in a range between about 300 and 800 Å. Layer 28 is used as an etch barrier layer later in the process.

As shown in FIG. 1, a first insulation layer 30 is formed over the first conformal layer 28. The conformal insulating layer 30 is preferably formed of silicon oxide or silicon nitride. The conformal insulating layer 30 is preferably composed of a silicon oxide such as a TEOS oxide. Layer 22 preferably has a thickness in a range between about 500 and 1500 Å.

The first conformal layer 28 and the first insulation layer 30 are patterned to form a contact opening 23 to the source region 26. Conventional photo processes can be used to form the contact opening. The contact opening preferably has a circular or rectangular shape.

As shown in FIG. 1, a first conductive layer 32 is formed over the first insulation layer 28 30 and in the contact opening 23. The first conductive layer is preferably formed of composed of polysilicon, and tungsten silicide; and is more preferably is formed of polysilicon. The first conductive layer is preferably formed of polysilicon having a thickness in a range of between about 4000 and 8000 Å. The first conductive layer is preferably formed of polysilicon doped with an impurity of phosphorus or arsenic; and with an impurity concentration in a range of between about 1E19 and 1E21 atoms/cm$^3$. The first conductive layer 32 can be planarized using, for example a chemical mechanical polish (CMP) process.

Next, a first masking layer 34 is formed over the first conductive layer 32. The first masking layer is preferably composed of silicon oxide or silicon nitride; and is more preferably composed of silicon oxide. The first masking layer preferably has a thickness in a range of between about 500 and 1500 Å.

Figure 2:
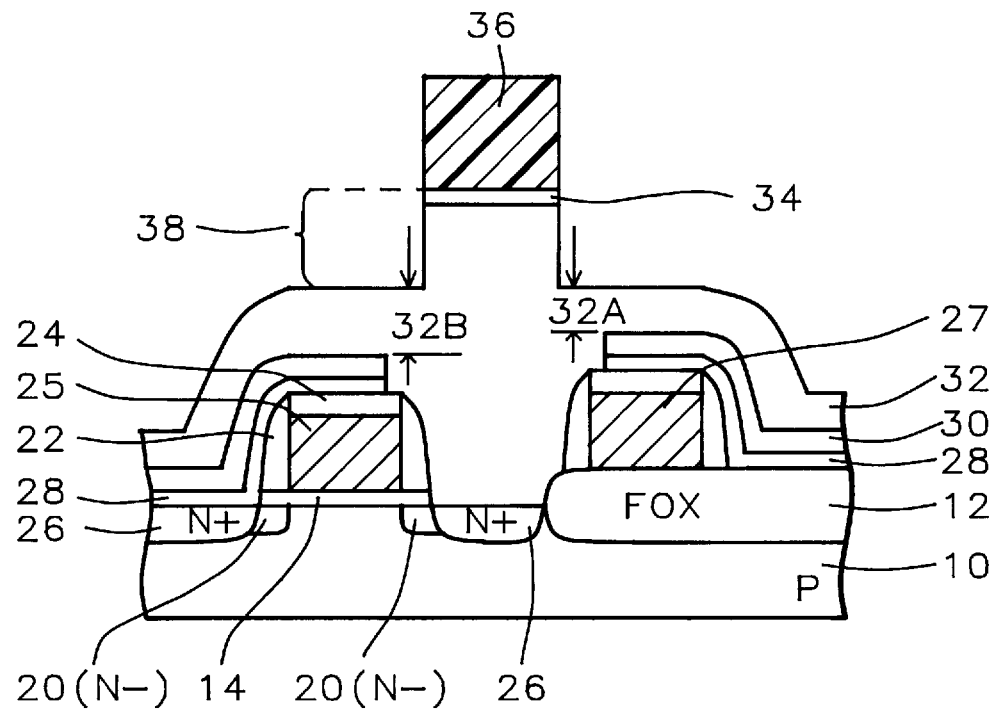
Figure 3:
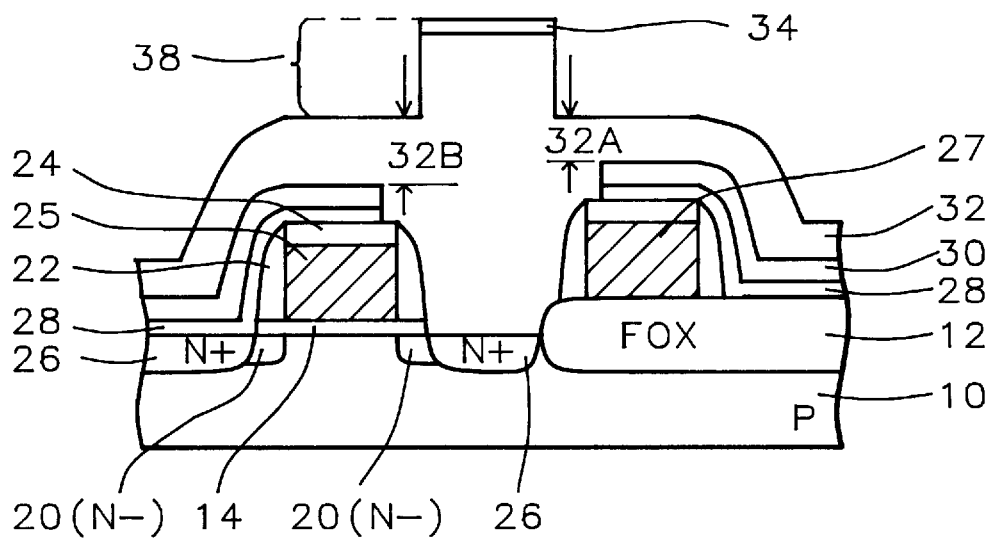

Turning to FIG. 2, a first photoresist layer 36 is formed over the first masking layer 34 over at least a portion of the source region 26. Then, the first masking layer 34 and the first conductive layer 32 are etched to form a first ridge 38 over at least portions of the source region 26 as shown in FIG. 3. The thickness 32A and 32B of the first conductive layer 32 may not be equal depending on the underlying devices. The masking layer 34 is preferably anisotropically etched using a chloride gas, such as a $Cl_2$ and HBr chemistry. The first conductive layer 32 is preferably anisotropically etched using a fluorine gas such as a $CF_4$ and $CHF_3$ etch chemistry. The first ridge can have any shape. The first ridge 38 preferably has a height 38 of between about 2000 and 4000 Å.

Figure 4:
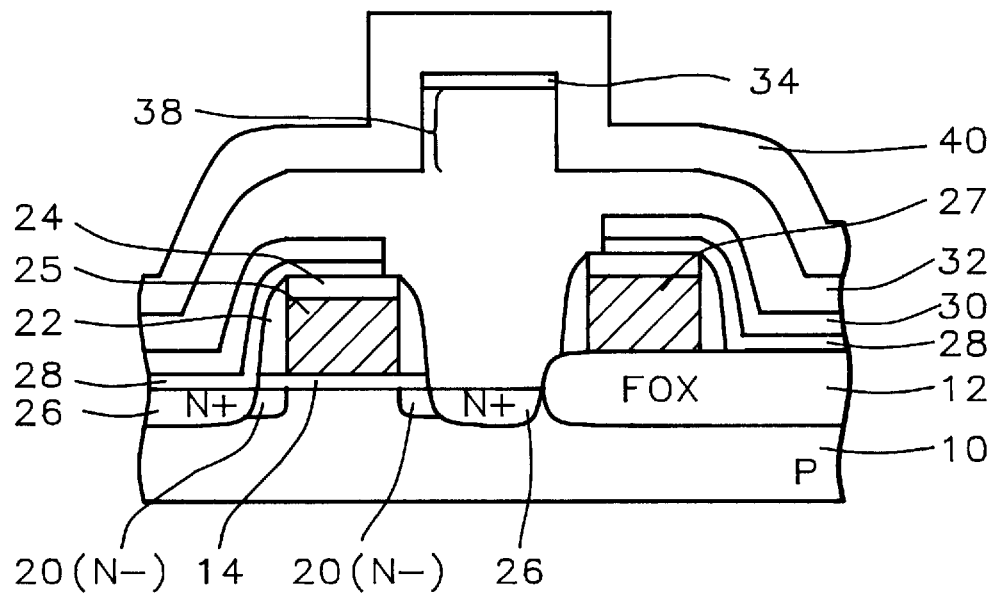
Figure 5:
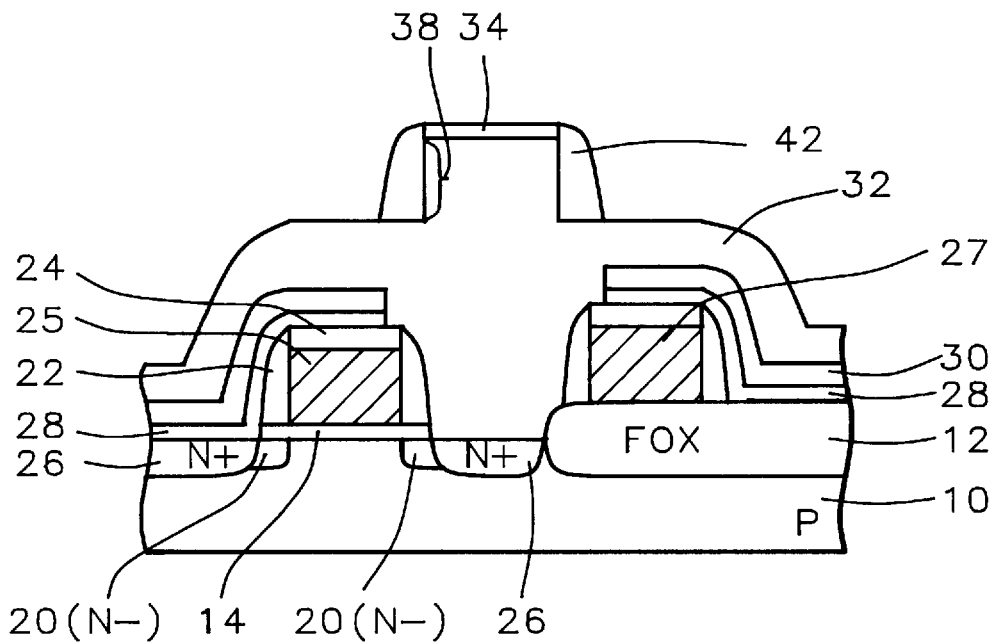

Referring to FIG. 4, a first dielectric layer 40 is then formed over the first conductive layer 32. The first dielectric layer 40 is preferably composed of silicon oxide or nitride, and is more preferably formed of silicon oxide. The first dielectric layer 40 preferably has a thickness in a range of between about 1000 and 3000 Å. Turning to FIG. 5, the first dielectric layer 40 is anisotropically etched to form spacers 42 on the sidewalls of the ridge 38.

Figure 6:
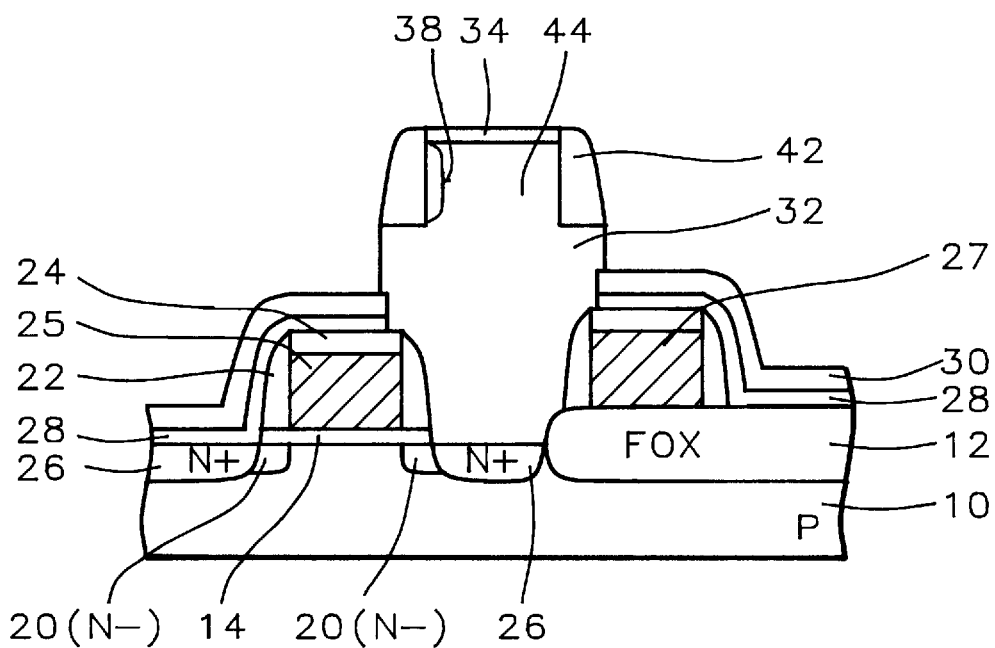

Turning to FIG. 6, the first conductive layer 32 and the first masking layer 34 are anisotropically etched using the spacers 42 and the masking layer 34 as an etch mask thereby forming the storage electrode 45 having a two step latter cross sectional shape from the remaining first polysilicon layer 32. This anisotropic etch can be accomplished by reactive ion etching with $Cl_2$ at 420 sccm, HBr at 80 sccm, and He at 180 sccm, at a pressure of about 300 mtorr, and a power of about 450 watts. A Rainbow 4400, manufactured by Lam Research Company, may be used for this etch.

Figure 7:
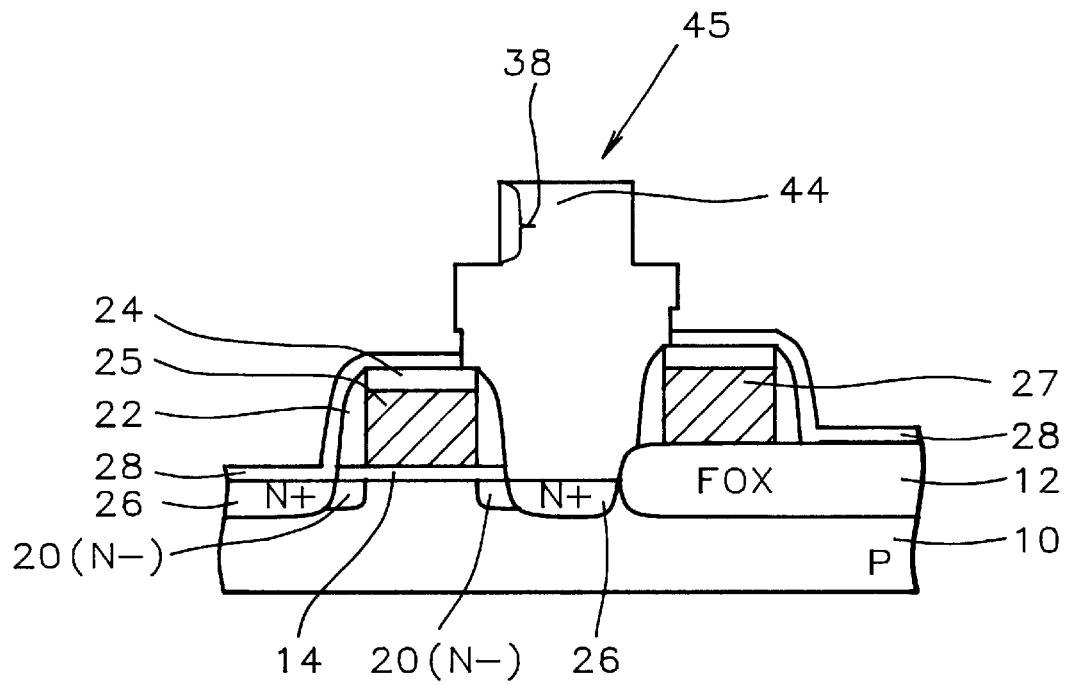
FIG. 7 is a cross sectional view of the storage electrode of the invention targeted along axis 7' in FIG. 9 illustrating a method for manufacturing the capacitor having a storage electrode with a two step ladder cross sectional shape according to the present invention.

The first masking layer 34, the spacers 42 and the first insulation layer 30 are then removed as shown in FIG. 7. A BF or a buffered oxide etch solution can be used the remove the first masking layer 34, the spacers 42 and the first insulation layer 30.

Figure 8:
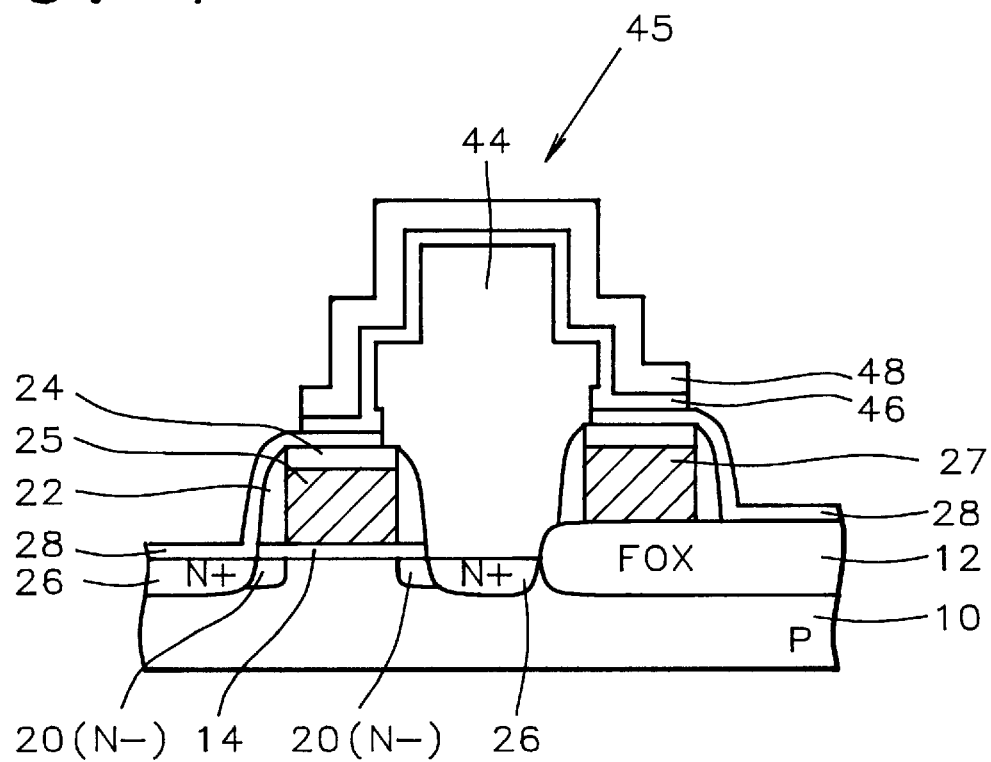
FIG. 8 is a cross sectional view illustrating a method for manufacturing the capacitor according to the present invention.
Figure 9:
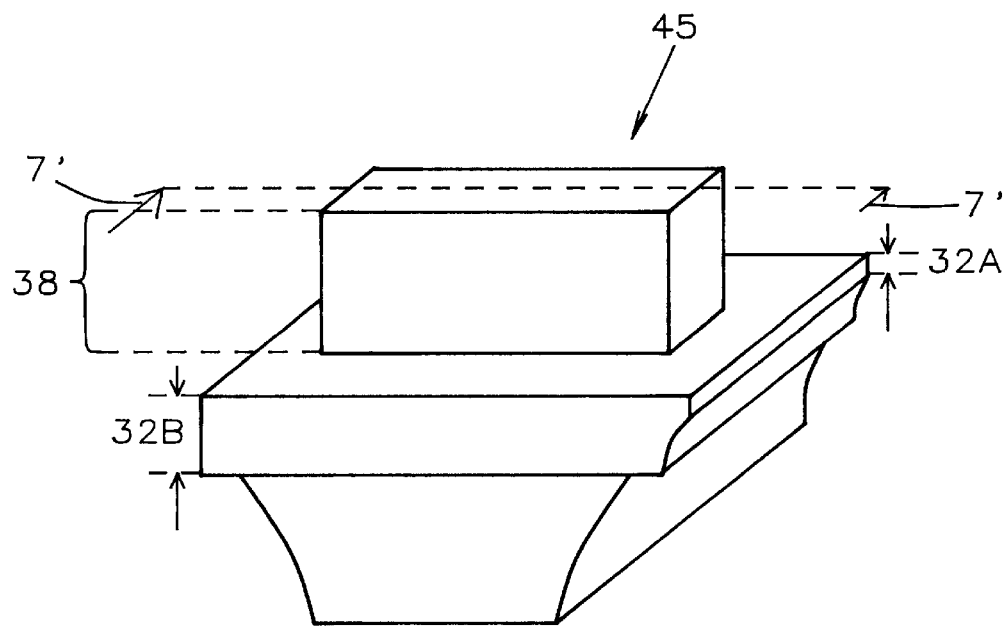
FIG. 9 is a three dimensional view of the storage electrode for illustrating a method for manufacturing the capacitor two step ladder cross sectional shape of a semiconductor memory device according to the present invention.

As shown in FIG. 8, a capacitor dielectric layer 46 is formed over the storage electrode 45 having the two step latter cross sectional shape. The capacitor dielectric layer 46 is preferably composed of a material selected from the group consisting of: a three layer structure of silicon oxide/silicon nitride/silicon oxide (ONO), a two layer structure of silicon oxide/silicon nitride (ON), and silicon nitride; and the capacitor dielectric layer 46 preferably has an overall thickness in a range of between about 80 and 250 Å.

A preferred dielectric is formed of ONO to a thickness of between about 30 and 90 Å. The bottom oxide is formed by exposure in DI water to a thickness of between about 20 and 40 Å. The middle nitride is formed by LPCVD at a temperature of about 760° C., a pressure of 350 mtorr, in $NH_3$ (ammonia) and $SiH_2Cl_2$, to a thickness of between about 20 and 50 Å. The top oxide is formed by oxidation in a dry oxygen ambient, at a temperature of about 850° C. for about 30 minutes. A top plate electrode over the capacitor dielectric layer is formed over the storage electrode 45 to form the DRAM cell. The top plate electrode is preferably formed of a doped polysilicon layer with a thickness preferably in a range between 1000 and 2000 Å. Also, other structures, such as bit lines and bit line contacts, can be formed anytime during the process to complete the DRAM cell.

The process of the current invention provides a high capacitance and dense capacitor which has a smooth topology. The two steps in the storage electrode produce a smooth surface which will not interfere with the overlying layers and therefore increases yields. The steps also increase the surface area and therefore the capacitance. The process is simple to manufacture and the spacers and the first insulation layer 30 allow tight dimensional process control of the steps sizes.

It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a stacked capacitor having a storage electrode with a two step ladder cross sectional shape, comprising the steps of a) providing a MOS (metal oxide semiconductor) device having source and drain regions in a substrate;

b) forming first insulation layer over said MOS device;

c) forming a first conductive layer and a first masking layer over said first insulation layer;

d) patterning said first masking layer and said first conductive layer to form a first ridge over at least portions of said source region, said first ridge having sidewalls;

e) forming a first dielectric layer over said first conductive layer;

f) anisotropically etching said first dielectric layer forming spacers on the sidewalls of said ridge;

g) anisotropically etching said first conducive layer using said spacers and said first masking layer as an etch mask thereby forming said storage electrode having a two step ladder cross sectional shape from the remaining first polysilicon layer;

h) removing said first masking layer and said spacers;

i) forming a capacitor dielectric layer over at least said storage electrode;

j) forming a top plate electrode over said capacitor dielectric layer to form said stacked capacitor.

2. The method of claim 1 wherein said first insulation layer is formed of a lower conformal layer of silicon nitride having a thickness in a range of between about 300 and 800 Å, and an upper layer of silicon oxide having a thickness in a range of between about 500 and 1500 Å, and step (h) further includes removing said an upper layer of silicon oxide.

3. The method of claim 1 wherein said first conductive layer is formed of polysilicon having a thickness in a range of between about 4000 and 8000 Å.

4. The method of claim 1 wherein said first conductive layer is formed of polysilicon doped with an impurity selected from the group consisting of: phosphorus and arsenic, and said first conductive layer has an impurity concentration in a range of between about 1E19 and 1E21 atoms/cm$^3$, and a thickness over said first insulating layer in a range of between about 4000 and 8000 Å.

5. The method of claim 1 wherein said first masking layer is formed of a material selected from the group consisting of silicon oxide and silicon nitride, and has a thickness in a range of between about 500 and 1500 Å.

6. The method of claim 1 wherein said first dielectric layer is formed of a material selected from the group consisting of: silicon oxide and silicon nitride, and has a thickness in a range of between about 1000 and 3000 Å.

7. The method of claim 1 wherein said first ridge 38 has a height in a range of between about 2000 and 4000 Å.

8. The method of claim 1 wherein said capacitor dielectric layer is composed of a material selected from the group consisting of: a three layer structure of silicon oxide/silicon nitride/silicon oxide (ONO), a two layer structure of silicon oxide/silicon nitride (ON), and silicon nitride, and said capacitor dielectric layer has a thickness in a range of between about 80 and 250 Å.

9. A method of fabrication of dynamic random access memory (DRAM) cell having a stacked capacitor with a storage electrode having a two step ladder cross sectional shape, comprising the steps of
   a) providing a MOS (metal oxide semiconductor) device having source and drain regions, adjacent to a field oxide region on which there is a conductive word line, in a silicon substrate;
   b) forming a first conformal layer composed of silicon nitride and a first insulation layer composed of silicon oxide over said MOS device, conductive word line and said field oxide region;
   c) patterning said first conformal layer and said first insulation layer to form a contact opening to said source region;
   d) forming a first conductive layer composed of polysilicon and a first masking layer composed of silicon oxide over said first insulation layer and in said contact opening;
   e) forming a first photoresist layer over portion of said first conductive layer covering the area over said source region where said storage electrode will be formed;
   f) etching said first masking layer and said first conductive layer to form a first ridge over at least portions of said source region, said first ridge having sidewalls;
   g) forming a first dielectric layer composed of silicon oxide over said first conductive layer;
   h) anisotropically etching said first dielectric layer to form spacers on the sidewalls of said ridge;
   i) anisotropically etching said first conducive layer using said spacers and said first masking layer as an etch mask thereby forming said storage electrode having a two step latter cross sectional shape from the remaining first polysilicon layer;
   j) removing said first masking layer and said spacers and said first insulation layer;
   k) forming a capacitor dielectric layer over at least said two step latter storage electrode; and
   l) forming a top plate electrode over said capacitor dielectric layer to form said DRAM cell.

10. The method of claim 9 wherein said first insulation layer is formed of silicon oxide having a thickness in a range of between about 500 and 1500 Å.

11. The method of claim 9 wherein said first conductive layer is formed of polysilicon having a thickness in a range of between about 4000 and 8000 Å.

12. The method of claim 9 wherein said first conductive layer is formed of polysilicon doped with an impurity selected from the group consisting of: phosphorus and arsenic, and said first conductive layer has an impurity concentration in a range of between about 1E19 and 1E21 atoms/cm$^3$, and a thickness over said first insulating layer in a range of between about 4000 and 8000 Å.

13. The method of claim 9 wherein said first masking layer has a thickness in a range of between about 500 and 1500 Å.

14. The method of claim 9 wherein said first dielectric layer is formed of a material selected from the group consisting of: silicon oxide and silicon nitride, and has a thickness in a range of between about 1000 and 3000 Å.

15. The method of claim 9 wherein said first ridge has a height in a range of between about 2000 and 4000 Å.

16. The method of claim 9 wherein said capacitor dielectric layer is composed of a material selected from the group consisting of: a three layer structure of silicon oxide/silicon nitride/silicon oxide (ONO), a two layer structure of silicon oxide/silicon nitride (ON), and silicon nitride, and said capacitor dielectric layer has a thickness in a range of between about 80 and 250 Å.

* * * * *